United States Patent
Pompei

(10) Patent No.: US 7,596,228 B2
(45) Date of Patent: Sep. 29, 2009

(54) PARAMETRIC ARRAY MODULATION AND PROCESSING METHOD

(76) Inventor: Frank Joseph Pompei, 16 Peck Ave., Wayland, MA (US) 01778

(*) Notice: Subject to any disclaimer, the term of this patent is extended or adjusted under 35 U.S.C. 154(b) by 817 days.

(21) Appl. No.: 10/525,539

(22) PCT Filed: Aug. 26, 2003

(86) PCT No.: PCT/US03/26998
§ 371 (c)(1),
(2), (4) Date: Feb. 24, 2005

(87) PCT Pub. No.: WO2004/019653
PCT Pub. Date: Mar. 4, 2004

(65) Prior Publication Data
US 2005/0207587 A1    Sep. 22, 2005

Related U.S. Application Data

(60) Provisional application No. 60/406,230, filed on Aug. 26, 2002.

(51) Int. Cl.
*H04B 3/00*  (2006.01)
(52) U.S. Cl. .................................. 381/77; 381/79
(58) Field of Classification Search ............... 381/77, 381/97, 98, 79, 81
See application file for complete search history.

(56) References Cited

U.S. PATENT DOCUMENTS

| | | | |
|---|---|---|---|
| 5,220,246 A | | 6/1993 | Ide et al. |
| 5,889,870 A | * | 3/1999 | Norris ........................ 381/77 |
| 6,044,160 A | * | 3/2000 | Norris ........................ 381/191 |
| 6,151,398 A | | 11/2000 | Norris |
| 6,445,804 B1 | | 9/2002 | Hirayanagi |
| 6,556,687 B1 | * | 4/2003 | Manabe ...................... 381/387 |
| 6,584,205 B1 | * | 6/2003 | Croft et al. .................. 381/98 |
| 7,162,042 B2 | * | 1/2007 | Spencer et al. ............... 381/77 |
| 7,224,808 B2 | * | 5/2007 | Spencer et al. ............... 381/77 |

* cited by examiner

*Primary Examiner*—Vivian Chin
*Assistant Examiner*—Jason R Kurr
(74) *Attorney, Agent, or Firm*—Weingarten, Schurgin, Gagnebin & Lebovici LLP

(57) ABSTRACT

A system using the nonlinearity of a propagation medium to demodulate an ultrasonic wave having audio modulated onto the ultrasonic frequency, audio signal processing circuitry providing a delayed audio signal and an envelope signal which is a function of peaks of the audio signal over a predetermined interval. The delayed audio signal and the envelope signals are combined with the delay in the audio allowing the envelope signal to accurately be aligned with the audio signal in the combination.

25 Claims, 5 Drawing Sheets

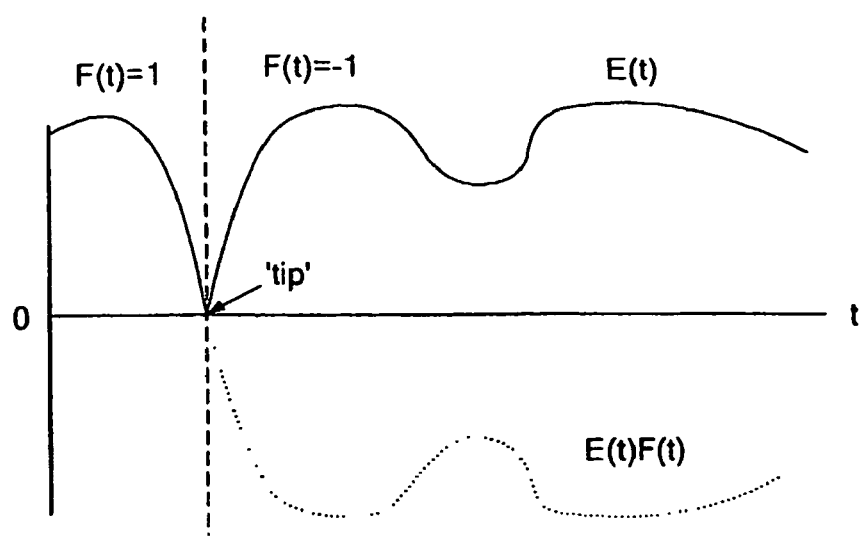
FIG. 5A
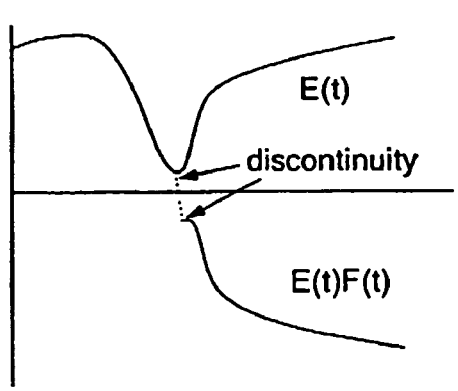  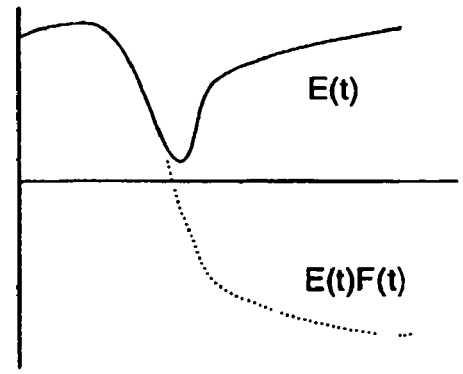
FIG. 5B                FIG. 5C

PARAMETRIC ARRAY MODULATION AND PROCESSING METHOD

CROSS REFERENCE TO RELATED APPLICATIONS

The present application incorporates by reference prior commonly owned U.S. Applications 60/185,235 filed Feb. 28, 2000; 60/406,230 filed Aug. 26, 2002; and Ser. No. 09/300,033.

FIELD AND BACKGROUND OF THE INVENTION

The parametric array uses the nonlinear response of a transmission medium such as air or water to convert or demodulate ultrasonic frequency waves into audio frequency waves of any audio frequency signals modulated onto the ultrasonic waves. This phenomenon is useful to direct a beam of ultra sound having audio modulated thereon to a specified region where it is demodulated in the medium and can be heard.

In a typical case of a parametric array in air, the audible signal will typically be from voice, music or other normal audio frequency source. Prior to or subsequent to the conversion or modulation into the ultrasound frequency ranges, some form of signal processing is typically undertaken. This is undertaken to compensate for the non-flat frequency response of typical ultrasound transducers, the transducer nonlinearity, environmental conditions of temperature and humidity and the position of the listening recipient among other effects that prevent a faithful reproduction of the original sound to the listener. The response of air to ultrasound is also nonlinear and may need compensation prior to the actual ultrasound emission.

The form of modulation typically employed provides a signal envelope on an ultrasonic carrier. The carrier and envelope have different response characteristics to the type of signal processing and the non-flat and nonlinear characteristics of the environment and devices used in this type of ultrasonic sound beaming from source to listener and a resulting lack of alignment.

SUMMARY OF THE INVENTION

The present invention uses an envelope summed with the audio signal and an envelope detector to supply an adjusting offset to the source audio signal, such that the envelope of the audio signal, when added to the audio signal, is entirely positive (or entirely negative). When this is the case, a nonlinear preprocessing method can be applied (such as taking the square root, or other nonlinear function) accurately. In addition, residual sound generated by the envelope signal should be inaudible in the resulting demodulated beam.

A preferred way to accomplish this would be to "look ahead" at the audio signal, to see what the (peak) values will be some time in the future, and begin adjusting the envelope signal well in advance of a change. Because a processing system cannot actually look into the future the invention either estimates the signal based on past knowledge or allow some small delay between the input and output signals. Using an audio signal delay, it is possible to anticipate the audio signal, and to change the envelope signal accordingly so that the sum conforms and remains positive. The result is an envelope signal which faithfully follows the peak levels of the audio signal, but changes only gradually (ensuring only very low-frequency residue).

DESCRIPTION OF THE DRAWING

This and other features of the invention are more fully described in the detailed description below in conjunction with the Drawing of which:

FIGS. 5A-5C illustrate further signal processing associated with FIG. 3 circuitry.

DETAILED DESCRIPTION

Figure 1A:
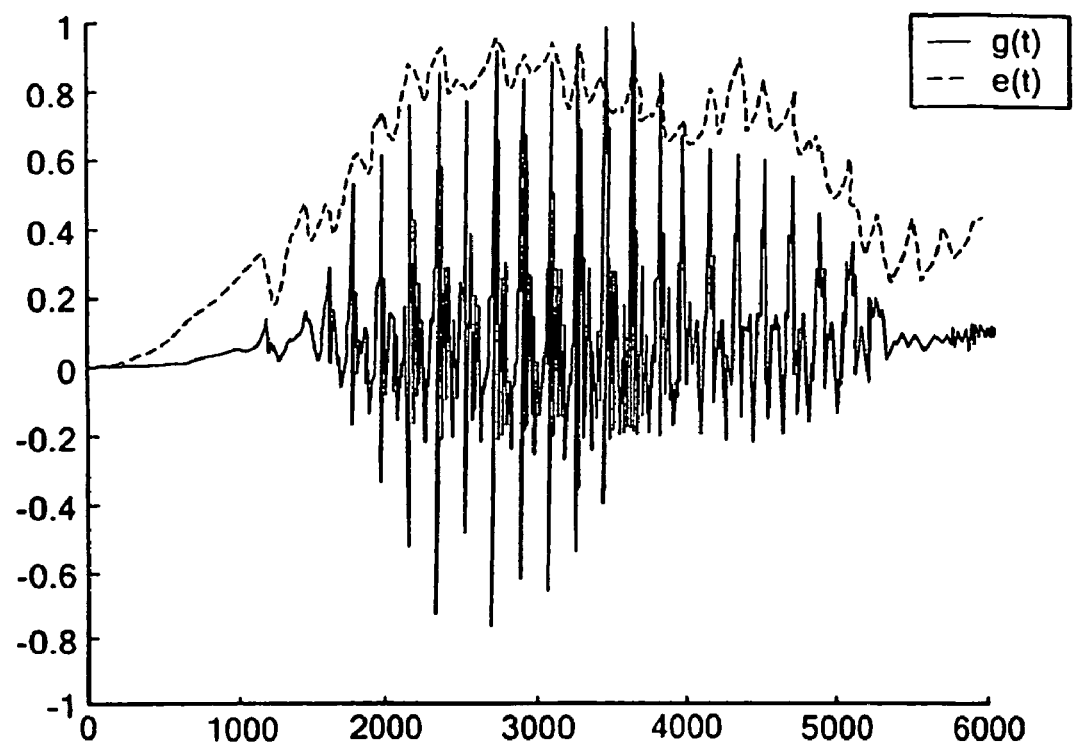
FIGS. 1A-1D are waveform diagrams on the summed audio and envelope useful in understanding the invention.

The generation of ultrasound from audible sound will in general require some step of modulation, which is simply a re-scaling of frequency. We can write this modulation step as:

$$p(t)=M(t)\sin \omega t$$

Where $M(t)$ can be termed the modulation envelope, and $\omega$ is the carrier frequency. Basic parametric array theory predicts that, upon demodulation, the resulting audible sound $q(t)$ is approximately proportional to the second derivative of the square of the modulation envelope:

$$q(t) \propto d^2/dt^2(M^2(t))$$

This function is an approximation, but serves well to illustrate the ideas contained herein.

We can define an arbitrary preprocessing function $P\{z\}$, which accepts some signal (primarily) in the audio range as input, and outputs a processed signal suitable for modulation oat the output. Thus, we generally have $M(t)=P\{z\}$, where z is some function of $g(t)$. Note that the algorithm $P\{x\}$ may also accept inputs such as environmental condition, listener position, desired sound quality, etc.

Early parametric arrays used simple AM modulation to generate the audible signal, using $M(t)=(1+mg(t))$, or $P\{z\}=z$, where $g(t)$ is the audible signal to be reproduced (assumed to be normalized to unity magnitude), and m is the modulation depth, usually taken as one or slightly less than one. The resulting sound generated is:

$$q(t) \propto d^2/dt^2(M^2(t))=2md^2/dt^2(g(t))+m^2 d/dt^2(g^2(t))$$

We can see that the resulting sound contains the desired linear term $g(t)$ (we will now omit the second derivative, it being a simple equalization step and simple to compensate by integrating $g(t)$ twice). We also have a nonlinear term $mg^2(t)$, which corresponds to distortion. If we require m to be small, the distortion will be reduced, but the corresponding output signal will also be reduced by the same factor, which is undesirable.

An improved method is to use $P\{z\}=z^{1/2}$, where $z=1+mg(t)$, leading to $M(t)=(1+mg(t))^{1/2}$. Upon demodulation, the resulting audible signal is proportional to $mg(t)$. While this is the result we seek, there are two drawbacks to this method. First, taking the square-root operation of a signal results in the generation of a substantial set of harmonics, which increase the required bandwidth of the ultrasonic transmission system. If the bandwidth of the transmission system is insufficient to reproduce the entire ultrasonic signal, distortion will result. This was investigated theoretically in [1] and experimentally in [2].

The preprocessing function $P\{z\}=z^{1/2}$ is a reasonably effective method of preprocessing the audible signal at low modulation frequencies and low ultrasonic amplitude. However, to improve performance, $P\{z\}$ should be altered to more accurately model the true nonlinear modulation function. The particular algorithm is described elsewhere (see referenced provisional), but we can generalize the function with a nonlinear piecewise polynomial function, and perhaps a linear filter.

A major shortcoming of having the argument $z=1+mg(t)$ is that when no audible sound is intended to be reproduced ($g(t)=0$), the modulation function $M(t)$ is unity ($M(t)=1$). This means that the system is still outputting high levels of ultrasound, which is not being used to create audio, as the output signals is still $p(t)=\sin \omega t$.

To alleviate this latter shortcoming, it has been proposed to use a modulation envelope which contains an envelope follower. This is commonly implemented as a rectifier and low-pass filter. The detected envelope of the audio input signal is intended to be a faithful follower of the amplitude of the input signal, although with some time delay. Adding this envelope to the audio signal can provide a suitable offset which keeps the signal positive, allowing an accurate preprocessing operation:

$$z(t)=e(t)+g(t)$$

$$M(t)=P\{z\}=(e(t)+g(t))^{1/2}$$

$$q(t) \propto d^2/dt^2(e(t)+g(t))$$

$$q(t) \propto d^2/dt^2(M^2(t))$$

The audible signal $g(t)$ (with second derivative omitted) is reproduced as before, and there is a residual term consisting of the second derivative of the audio envelope $e(t)$. As long as this frequency is low (recall that it is the result of a low-pass filter), it should not reproduce substantial distortion components. In general, we wish the frequency of the envelope $e(t)$ to be lower than about 100 Hz.

FIG. 1A illustrates the problem of this type of envelope detector in that the envelope curve 12 in following the audio signal at a cut off in the vicinity of 100 Hz isn't a good peak follower and is at times below the audio signal.

The main goal of the envelope detector is to supply an appropriate offset to the incoming audio signal, such that the envelope, when added to the audio signal, is entirely positive. When this is the case, a nonlinear preprocessing method $P\{z\}$ can be applied (such as taking the square root, or other nonlinear function) accurately. In addition, residual sound generated by the envelope signal $e(t)$ should be inaudible in the resulting demodulated beam. The slow changing function $e(t)$ cannot accurately keep up with a generally fast-changing dynamic audio signal $g(t)$.

An elegant solution according to the invention is to "look ahead" at the audio signal, to see what the (peak) values will be some time in the future, and begin adjusting the envelope signal well in advance of a change. Because our processing system must be causal (we cannot actually look into the future), we may either guess at the signal based on past knowledge, or, even easier, allow some small delay between the input and output signals. If the audio signal is delayed, there is opportunity to anticipate the signal, and begin to change the envelope signal accordingly. The result is an envelope signal which faithfully follows the peak levels of the audio signal, but changes only gradually (insuring only low-frequency residue).

Figure 2:
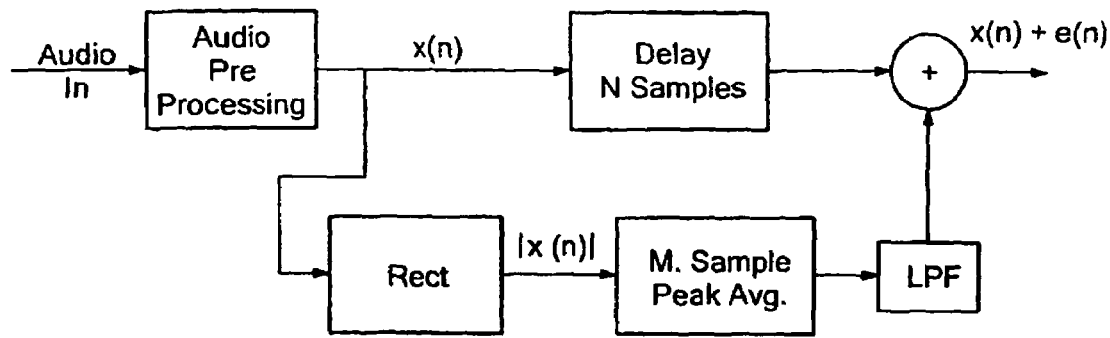
FIG. 2 is a block diagram illustrating the practice of the invention.

A block diagram showing this method employed in discrete time (as in a DSP) is shown in FIG. 2. As the processing my be digital or analog, hardware of software based, it is to be under stood that the circuit description applies as hardware modules of processing steps in the following description.

The input (audio) signal x[n], 16, which may have been processed in a processor 18 (i.e. equalized, filtered to remove all low-frequency content, etc.) is split onto two paths 20 and 22. The signal on path 20 is first rectified in a rectifier module or step (assuming DSP) 24, or other envelope detection, to determine its magnitude. The peak value of this rectified signal is tacked in a module or step 26 over the previous M samples, represented by p[n]. This peak signal p[n] is then low pass filtered in a filter 28, generally a very low frequency, and the result is the envelope e[n]. The raw signal, x[n] on path 22 is delayed in delay module or step 30 by N samples or a predetermined interval, which effectively corresponds to the settling time (or group delay) of the low pass filter 28, plus any other delay present in the signal path. This ensures that the envelope e[n] is properly aligned to the audio signal x[n]. Finally, the envelope signal and audio signal are summed in summer as shown. The result is an accurately offset signal, which is always positive, and is suitable for nonlinear preprocessing (such as square-rooting) through $P\{z\}$ and modulation.

As a variation, since we are primarily concerned with keeping x[n] positive, we need only concern ourselves with tracking the negative peaks of x[n]. Thus the absolute value or rectifier function could be replaced with an inverter (−x), and the peak detector, rather than locating the maximum of M previous samples of x[n], would locate and track the minimum (maximally negative) samples of x[n].

Figure 1B:
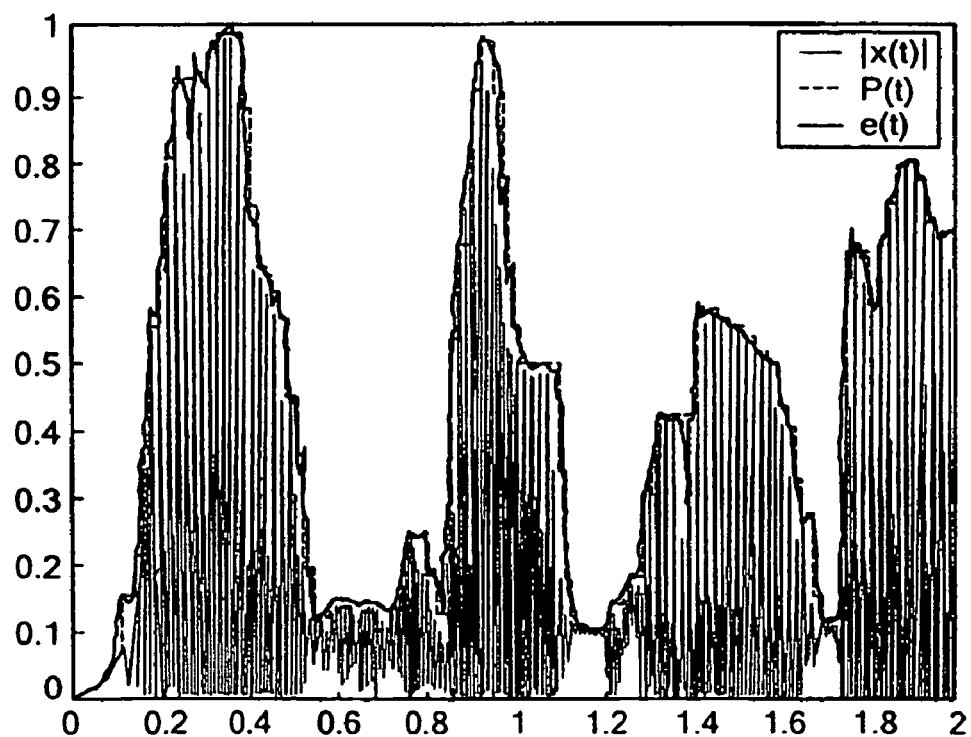
Figure 1C:
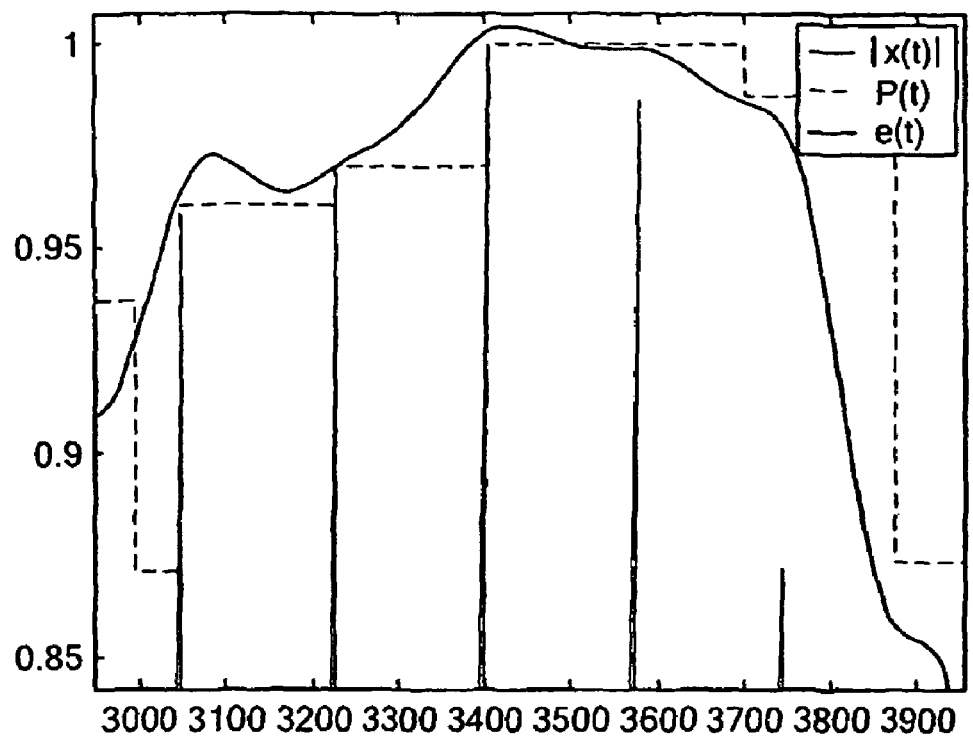
Figure 1D:
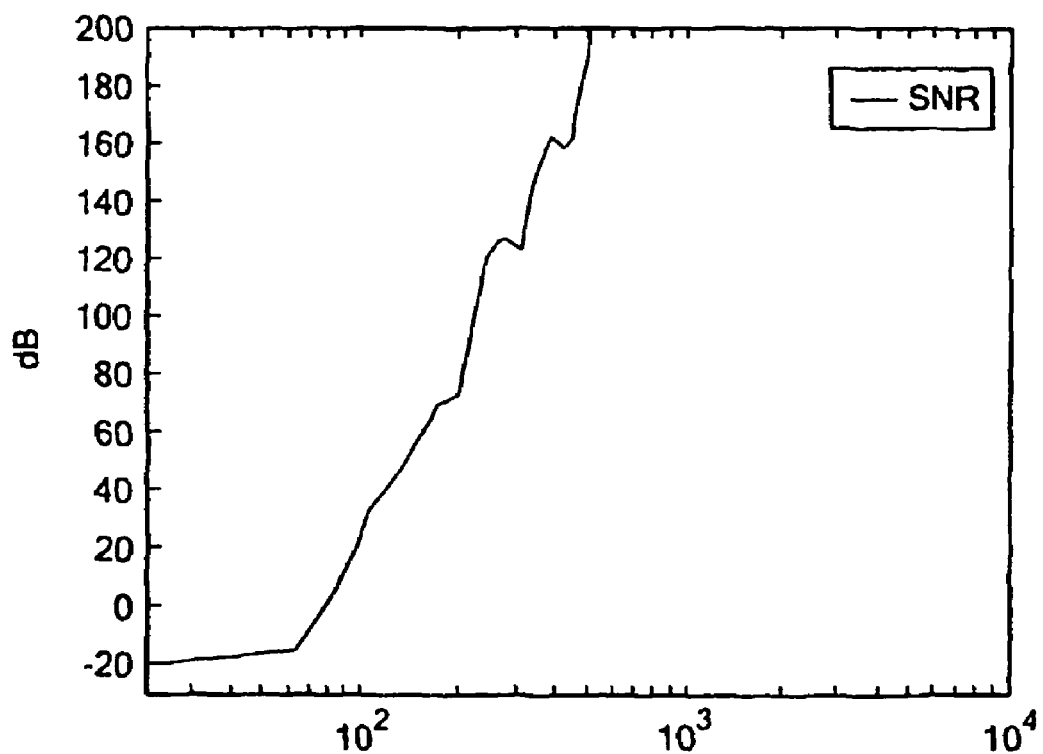

FIG. 1B and FIG. 1C which is a magnification of a portion 34 in FIG. 1B shows the effective of this processing where envelope and signal functions are brought into alignment. FIG. 1D shows the ratio of the signal level to the noise level for such an approach as a function of frequency and illustrates acceptable levels of S/N values.

Figure 3:
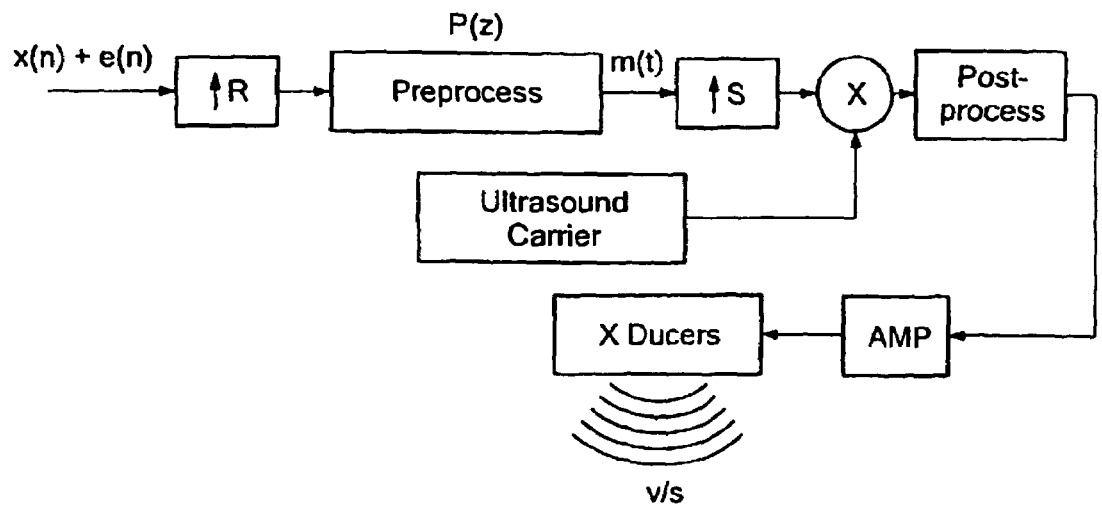
FIG. 3 is a block diagram illustrating signal processing providing compensation for characteristics of using ultrasound audio projection according to the invention.

FIG. 3 illustrates a complete system from audio input to sound wave output and applies generally to either hardware or software realization. The x(n)+e(n) output of the FIG. 2 processing is optionally applied to an upsampling and low pass filtering module or step 40 which improves the available bandwidth for use in a subsequent preprocessing module or step 42 characterized by the function P(z). The preprocessing function, more fully described below, is generally nonlinear and functions at least in part to compensate for the nonlinearities in the ultrasound generation and demodulation functions. The sampling rate of function 40 is preferably sufficiently high so that the harmonics inherent in the non linear processing do not alias and create unintended distortion.

The preprocessed signal may subsequently be upsampled and low pass filtered in module or step 44 after which it is modulated in modulator or step 46 onto an ultrasonic frequency carrier from carrier generator or step 48.

The modulated signal is then optionally post processed in a module or step 50 which may include equalization to compensate for frequency dependent variations in the transfer functions of subsequent ultrasonic amplifiers 52 and transducers 54 or nonlinear processing to compensate for non linear transfer functions in these same elements 52 and 54. Other processing may be added here to accommodate environmental air characteristics or phased array phasing. Alternatively the modulated and/or post processed signal could be converted into pulse width modulated waveform or the like for driving amplifiers 52 where they are switching amplifiers.

The preprocessing module or step 42 in the simplest form consistent with providing a low distortion audio demodulated signal has a square root function. Because the nonlinear nature of the preprocessing generates harmonics and because the subsequent amplification and transduction functions have limited bandwidth, other approaches such s a polynomial expansion of the type $P(z)=a_0+a_1z+a_2z^2 \ldots$, the a's being functions of the particular environmental and processing system characteristics. More sophisticated processing could be a polynomial with coefficients that are non zero for specific value ranges or other forms of series.

Figures 4A, 4B, 4C, 4D:
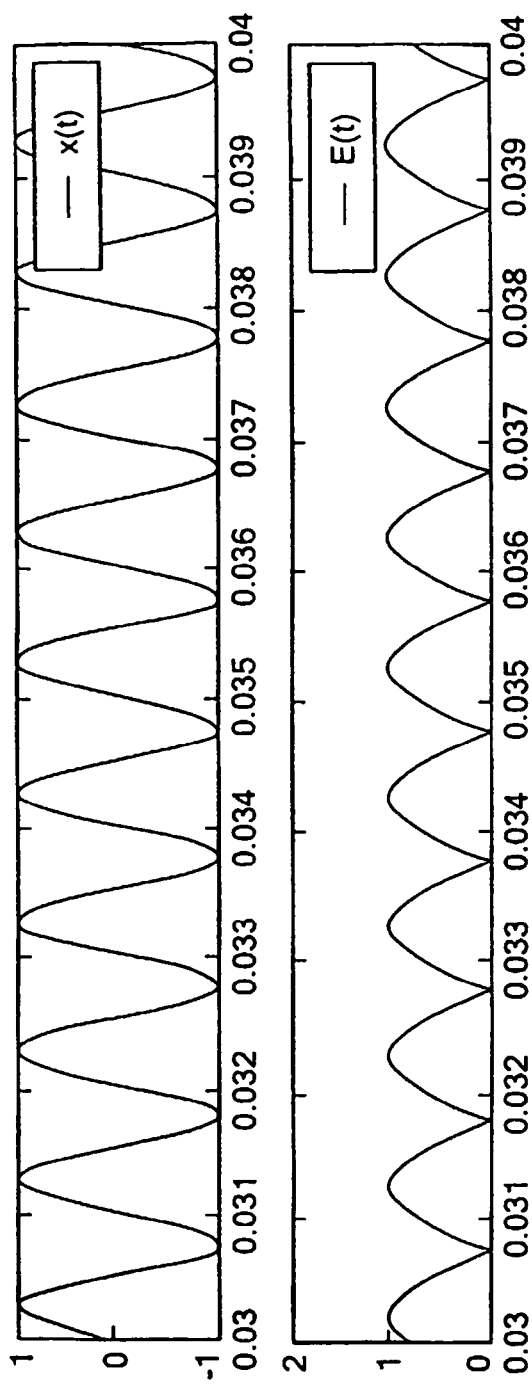
FIGS. 4A-4D illustrate signal processing associated with FIG. 3 circuitry.

The processing of a monotone, shown in FIG. 4A, at the point of preprocessing to give E(t) is shown in FIG. 4B. This creates singularities near or at the zero crossing which contributes to a large bandwidth due to the high values of the derivatives at the abrupt reversal. One approach to curing this problem is to modulate E(t) with a bipolar squarewave, F(t), as shown in FIG. 4C which produces the low bandwidth signal, E(t)F(t) of FIG. 4D.

This approach can be modified for use with real signals of unpredictable frequency content by reversing the bipolar signal F(t) of based on an estimating function in the preprocessor 42 causing the polarity reversal when one of the following criteria are met:
  i. E(t) proximity to zero;
  ii. Magnitude of derivatives of E(t) are high (either first or higher order derivatives);
  iii. E'(t) zero crossing from negative to positive (i.e. E' is zero while E" is positive);
  iv. A short-time power spectrum analysis is made and the result shows a high bandwidth.

FIG. 5A shows the operation when the signal envelope, E(t), nears zero showing how E(t)F(t) functions to provide a smoothing function. In the case where the polarity reversal occurs when the envelope signal E(t) is near but not at the zero crossing as shown in FIG. 5B, a discontinuity with consequent perturbances can occur. To rectify this situation, preprocessor 42 can add in a spline segment as shown in FIGS. 5B and 5C to produce the smooth transition from E(t) to E(t)F(t).

The features of the can be realized in alternative, equivalent ways. For example, either changing the carrier level directly or the offset of the audio signal are mathematically substantially equivalent and thus functionally equivalent.

The invention claimed is:

1. A system using the nonlinearity of a propagation medium to demodulate ultrasonic waves having an audio signal modulated onto the ultrasonic frequency, comprising:
  audio signal processing circuitry including:
    delay means for the audio signal providing a delayed audio signal;
    envelope generator means providing an envelope signal which is responsive to negative peaks of the audio signal over a predetermined interval; and
    combiner means for the delayed audio signal and the envelope signal, the resulting combined signal being useful in processing for modulation of said ultrasonic frequency; and
  premodulation processing means for processing the combined signal including the delayed audio signal and the envelope signal, thereby allowing the propagation medium demodulation to provide a demodulated acoustic signal which is a substantially accurate representation of the audio signal.

2. The system of claim 1 wherein at least one of said delay means and said envelope generator means comprise analog circuitry.

3. The system of claim 1 wherein at least one of said delay means and said envelope generator means comprise digital circuitry.

4. The system of claim 3:
  wherein both said delay means and said envelope generator means comprise digital circuitry;
  wherein means are provided for providing digital sampling of said audio signal, thereby providing a digitized audio signal;
  wherein said delay means delays N samples of said digitized audio signal; and
  wherein said envelope generator means examines M prior samples of said digitized audio signal.

5. The system of claim 4 wherein N and M are set at values to align the digitized audio signal to corresponding times in the envelope signal.

6. The system of claim 1 further including a low pass filter for the envelope signal and having a settling time or group delay where a delay interval corresponds to a settling time or group delay of the low pass filter.

7. The system of claim 1 wherein said premodulation processing means generates an approximate square root function on the combined signal.

8. The system of claim 1 wherein said premodulation processing means processes said combined signal by a polynomial expansion of a predetermined number of terms.

9. The system of claim 1 wherein said premodulation processing means processes said combined signal by use of a precalculated lookup table.

10. The system of claim 1 wherein said premodulation processing means includes upsampling and low pass filter means to provide an enhanced bandwidth prior to premodulation processing.

11. The system of claim 1 further including up sampling and low pass filter means prior to any modulation.

12. The system of claim 1 wherein, in response to the negative peaks of the audio signal, said premodulation processing means provides for dynamic polarity reversal of the combined, processed signal prior to modulation at one or more specified times within a predetermined interval, thereby reducing bandwidth of the modulated ultrasonic frequency.

13. The system of claim 12 wherein said one or more specified times corresponds to one or more of criteria that the unmodulated, processed signal as applied to the premodulation processing means is:
  close to a zero value;
  has a relatively high slope;
  has a short-time power spectrum estimate that indicates a wide bandwidth; and
  has a slope that is near a zero value while a rate of change of the slope is positive.

14. The system of claim 1 further including means for ultrasonically modulating the combined signal.

15. The system of claim 14 further including means for projecting ultrasonic sound wave representations of the modulated combined signal.

16. The system of claim 15 wherein said projecting means includes amplifier means and transducer means.

17. The system of claim 16 further including means for providing an offset bias in the modulated signal.

18. The system of claim 17 wherein said offset bias maintains the modulated signal in a predetermined polarity.

19. In a system using the nonlinearity of a propagation medium to demodulate ultrasonic waves having an audio signal modulated onto the ultrasonic frequency, audio signal processing circuitry comprising:

envelope generator means for tracking negative peaks of the audio signal over a predetermined interval and inverting the negative peaks, thereby providing an envelope signal which is an approximate function of the inverted negative peaks of the audio signal over said predetermined interval, said approximate function having misalignment of the envelope signal and the audio signal; and means for converting the audio signal and the envelope signal into an ultrasonic signal characterized by a carrier signal and reduced misalignment.

20. The audio signal processing circuitry of claim 19 wherein said converting means includes means for delaying the audio signal.

21. The audio signal processing circuitry of claim 19 wherein said converting means includes means for adjusting the level of said carrier signal to reduce said misalignment.

22. The audio signal processing circuitry of claim 19 wherein said means for converting includes means for providing for polarity reversal of the unmodulated, combined, processed signal at one or more specified times within a predetermined interval in response to negative peaks of the audio signal, thereby reducing frequency bandwidth of the modulated ultrasonic signal.

23. In a system using the nonlinearity of a propagation medium to demodulate ultrasonic waves having an original audio signal modulated onto the ultrasonic frequency, an audio signal processing method comprising the steps of:

delaying the original audio signal to provide a delayed audio signal;

generating an envelope signal which is responsive to negative peaks of the audio signal over a predetermined interval;

combining the delayed audio signal and the envelope signal to produce a combined signal useful in processing for modulation of said ultrasonic frequency; and in a processing step, processing the combined signal including the delayed audio signal and the envelope signal, thereby allowing the propagation medium demodulation to provide a demodulated acoustic signal which is a substantially accurate representation of the original audio signal.

24. The method of claim 23 wherein said processing step includes the step of adjusting the level of a carrier signal to increase tolerance for misalignment of the envelope signal and the audio signal.

25. The method of claim 23 wherein said processing step includes the step of providing for polarity reversal of the combined, processed signal prior to modulation at one or more specified times within a predetermined interval in response to the negative peaks of the audio signal, thereby reducing bandwidth of the modulated ultrasonic frequency.

* * * * *

UNITED STATES PATENT AND TRADEMARK OFFICE
CERTIFICATE OF CORRECTION

PATENT NO. : 7,596,228 B2  Page 1 of 1
APPLICATION NO. : 10/525539
DATED : September 29, 2009
INVENTOR(S) : Frank Joseph Pompei It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 1192 days.

Signed and Sealed this

Twenty-eighth Day of September, 2010

David J. Kappos
*Director of the United States Patent and Trademark Office*